US010637533B2

(12) United States Patent
Contreras et al.

(10) Patent No.: US 10,637,533 B2
(45) Date of Patent: Apr. 28, 2020

(54) DEDICATED TERMINATION DIES FOR MEMORY SYSTEMS

(71) Applicant: Western Digital Technologies, Inc., San Jose, CA (US)

(72) Inventors: John Thomas Contreras, Palo Alto, CA (US); Sayed Mobin, Milpitas, CA (US); David Zhang, Milpitas, CA (US); Gokul Kumar, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 15 days.

(21) Appl. No.: 16/146,238

(22) Filed: Sep. 28, 2018

(65) Prior Publication Data

US 2020/0106478 A1    Apr. 2, 2020

(51) Int. Cl.
*H04B 3/54* (2006.01)
*H01L 25/065* (2006.01)

(52) U.S. Cl.
CPC ........... *H04B 3/54* (2013.01); *H01L 25/0657* (2013.01); *H01L 2225/06541* (2013.01)

(58) Field of Classification Search
CPC ............... H04B 3/54; H01L 25/0657; H01L 2225/06541
See application file for complete search history.

(56) References Cited

U.S. PATENT DOCUMENTS

| | | | |
|---|---|---|---|
| 2010/0327902 A1 | 12/2010 | Shau | |
| 2013/0031326 A1* | 1/2013 | Grunzke | G11C 5/04 711/167 |
| 2015/0279444 A1 | 10/2015 | Vergis et al. | |
| 2018/0261286 A1* | 9/2018 | Hermesh | G11C 13/004 |

* cited by examiner

*Primary Examiner* — Daniel D Chang
(74) *Attorney, Agent, or Firm* — Brinks Gilson & Lione

(57) ABSTRACT

An apparatus includes a controller die and a group of dies that communicate with each other via a transmission line. Less than all of the dies of the group includes a respective on-die termination resistance circuit coupled to the transmission line. In some embodiments, one of the dies that includes an on-die termination resistance circuit is an end die of the group. In particular embodiments, the end die is the only die of the group that includes an on-die termination resistance circuit coupled to the transmission line. Transmission frequencies or data rates may be increased without degrading signal quality by removing capacitance associated with on-die termination resistance circuits from at least one of the dies of the group.

19 Claims, 7 Drawing Sheets

DEDICATED TERMINATION DIES FOR MEMORY SYSTEMS

BACKGROUND

A memory system may communicate signals carrying data, command, or clocking information for the storage of data within the memory system. The signals may be communicated along signal paths or transmission lines. The memory system may include memory dies that include the storage elements that store data. The memory dies have an associated die capacitance, which in turn affects the characteristic impedances of the transmission lines and the operation frequency or bandwidth at which signals over the transmission lines may be communicated. In general, higher die capacitance limits the frequency or bandwidth at which the signals can be communicated. Accordingly, ways to improve die capacitance to allow for increased frequency and bandwidth without degrading signal quality may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION OF EMBODIMENTS

Overview

Figure 1A:
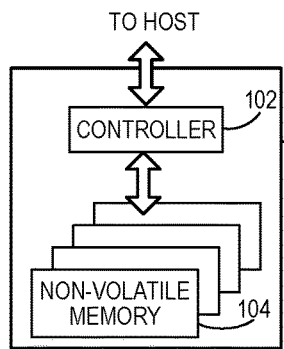
FIG. 1A is a block diagram of an example memory system.

By way of introduction, the below embodiments relate to reducing effective die capacitance through elimination of on-die termination (ODT) resistance circuits from one or more dies of a die group, such as a die stack, which in turn, may allow for increased frequency, bandwidth, and/or data rates over transmission lines coupled to the die group. In one embodiment, an apparatus that includes a transmission line and a group of dies coupled to the transmission line. The group of dies includes: a first die configured with an on-die termination resistance circuit coupled to the transmission line; and a second die configured without any on-die termination resistance circuits coupled to the transmission line.

In some embodiments, wherein none of the other dies of the group, except the first die, comprises a respective on-die termination resistance circuit coupled to the transmission line.

In some embodiments, the first die comprises an end die of the group.

In some embodiments, the group of dies is coupled to the transmission line via a wire bond portion of the transmission line.

In some embodiments, the group of dies is configured as a die stack.

In some embodiments, the die stack comprises a staircase stack.

In some embodiments, the group of dies is configured to communicate over the transmission line at a predetermined high frequency and at a predetermined low frequency, and wherein the on-die termination resistance circuit is configured to: set an associated resistance at a low level when the group of dies communicates over the transmission line at the predetermined high frequency; and set the associated resistance at a high level when the group of dies communicates over the transmission line at the predetermined low frequency.

In other embodiment, an apparatus includes: a controller die, and a group of dies configured to communicate with the controller die via a transmission line, wherein the group of dies comprises a plurality of memory dies and an end die. The group of dies includes at least one on-die termination circuit coupled to the transmission line. Additionally, less than all of the group of dies comprises a respective one of the at least one on-die termination circuit.

In some embodiments, only one of the dies of the group comprises the at least one on-die termination circuit coupled to the transmission line.

In some embodiments, the only one of the dies comprises the end die.

In some embodiments, the end die is configured to store data.

In some embodiments, the end die is configured to perform error correction.

In some embodiments, the end die does not include additional circuitry other than input/output contact pads and on-die resistance circuits.

In some embodiments, the group of dies is coupled to the transmission line via a wire bond portion of the transmission line.

In some embodiments, the group of dies is configured as a die stack.

In some embodiments, the die stack comprises a staircase stack.

In some embodiments, the controller die and the group of dies are configured to communicate over the transmission line at a predetermined high frequency and at a predetermined low frequency. The at least one on-die termination resistance circuit is configured to: set an associated resistance at a low level for communication over the transmission line at the predetermined high frequency, and set the associated resistance at a high level for communication over the transmission line at the predetermined low frequency.

In another embodiment, a method includes: setting an on-die termination resistance circuit of an end die of a group of dies to a low level, where the on-die termination resistance circuit is coupled to a transmission line, and where no other dies of the group of dies comprises a respective on-die termination resistance circuit; and communicating a signal over the transmission line between the group of dies and a controller die with the on-die termination resistance circuit set to the low level.

In some embodiments, communicating the signal comprises communicating the signal at a predetermined high frequency, and setting the on-die termination resistance circuit to the low level is dependent on communicating the signal at the predetermined high frequency.

In some embodiments, the method includes: setting the on-die termination resistance circuit of the end die to a high level dependent on communicating a second signal over the transmission line at a predetermined low frequency; and communicating the second signal over the transmission line between the group of dies and the controller die with the on-die termination resistance circuit set to the high level.

Other embodiments are possible, and each of the embodiments can be used alone or together in combination. Accordingly, various embodiments will now be described with reference to the attached drawings.

Embodiments

The following embodiments describe systems, apparatuses, devices, circuits, and methods for configuring less than all of a group of dies coupled to a transmission line with a respective on-die termination (ODT) resistance circuit coupled to the transmission line. Before turning to these and other embodiments, the following paragraphs provide a discussion of exemplary memory systems and storage modules that can be used with these embodiments. These are just examples, and other suitable types of systems, apparatuses, devices, or circuits, including other types of memory systems and/or storage modules, can be used.

FIG. 1A is a block diagram illustrating a memory system 100, such as a non-volatile memory system. The memory system 100 may include a controller 102 and memory that may be made up of a plurality of memory dies 104. As used herein, the term memory die refers to the set of memory cells (including non-volatile memory cells), and associated circuitry for managing the physical operation of those memory cells, that are formed on a single semiconductor substrate. In addition, the term die, in general, may refer to circuitry or circuit components on a single semiconductor substrate, but may or may not include memory cells to store data. The controller 102 may interface with a host system and transmit command sequences for read, program, and erase operations to the non-volatile memory dies 104. Herein, the controller 102 is referred to as a controller die 102 to identify or highlight that the circuitry of the controller 102 is configured or located on a die separate from the plurality of memory dies 104. The controller die 102 and each of the memory dies 104 may be configured or function as transceiver circuits, in that they each can transmit and receive signals. As described in further detail below, the controller die 102 and the plurality of memory dies 104 are configured to communicate with each other over a plurality of transmission lines.

The controller die 102 can take the form of processing circuitry, a microprocessor or processor, and a computer-readable medium that stores computer-readable program code (e.g., software or firmware) executable by the (micro) processor, logic gates, switches, an application specific integrated circuit (ASIC), a programmable logic controller, and an embedded microcontroller, for example. The controller die 102 can be configured with hardware and/or firmware to perform the various functions described below. Also, some of the components shown as being internal to the controller die 102 can also be stored external to the controller die 102, and other components can be used. Additionally, the phrase "operatively in communication with" could mean directly in communication with or indirectly (wired or wireless) in communication with through one or more components, which may or may not be shown or described herein.

The controller die 102 is configured to manage data stored in memory cells of the memory dies 104 and also to communicate with a host, such as a computer or electronic device. The controller die 102 can have various functionality in addition to the specific functionality described herein. For example, the controller die 102 can format the memory cells and/or the circuitry of the memory dies 104 to ensure the memory dies 104 operate properly, map out bad or defective memory cells, and allocate spare cells to be substituted for future failed cells. Some part of the spare cells can be used to hold firmware to operate the controller die 102 and implement other features. In operation, when a host needs to read data from or write data to the memory die 104, the host communicates with the controller die 102. If the host provides a logical address to which data is to be read/written, the controller die 102 can convert the logical address received from the host to a physical address in the memory dies 102. (Alternatively, the host can provide the physical address). The controller die 102 may also be configured to perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller die 102 and the memory dies 104 may be any suitable memory interface, such as Toggle Mode 200, 400, or 800. In one embodiment, the memory system 100 may be a card based system, such as a secure digital (SD) or a micro secure digital (micro-SD) card. In an alternate embodiment, the system 100 may be part of an embedded memory system.

Figure 1B:
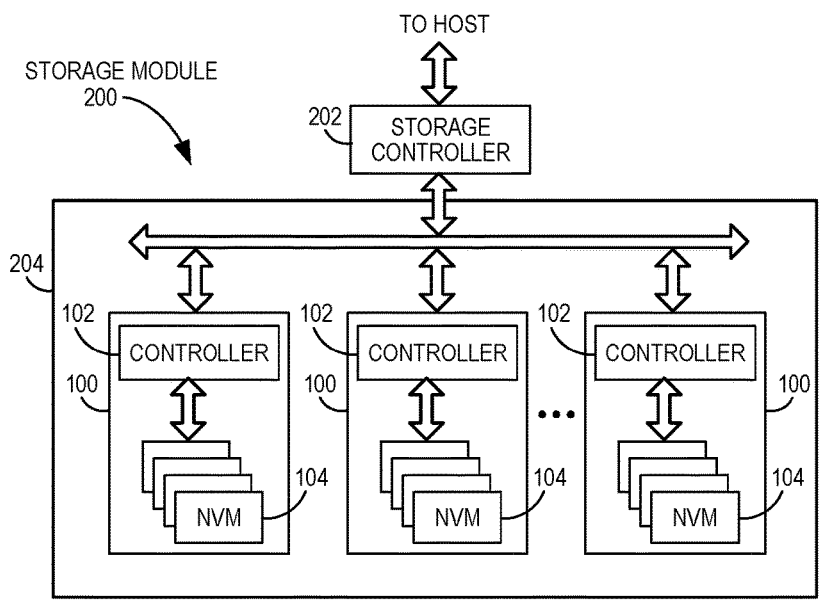
FIG. 1B is a block diagram of a storage module that includes a plurality of memory systems.

FIG. 1B illustrates a storage module 200 that includes a plurality of memory systems 100. As such, the storage module 200 may include a storage controller 202 that interfaces with a host and with a storage system 204, which includes a plurality of memory systems 100. The interface between the storage controller 202 and memory systems 100 may be a bus interface, such as a serial advanced technology attachment (SATA), a serial attached SCSI (SAS), a peripheral component interface express (PCIe) interface, an embedded MultiMediaCard (eMMC) interface, a SD interface, or a Universal Serial Bus (USB) interface, as non-limiting examples. The storage system 200, in one embodiment, may be a solid state drive (SSD), such as found in portable computing devices, such as laptop computers and tablet computers, and mobile phones.

Figure 1C:
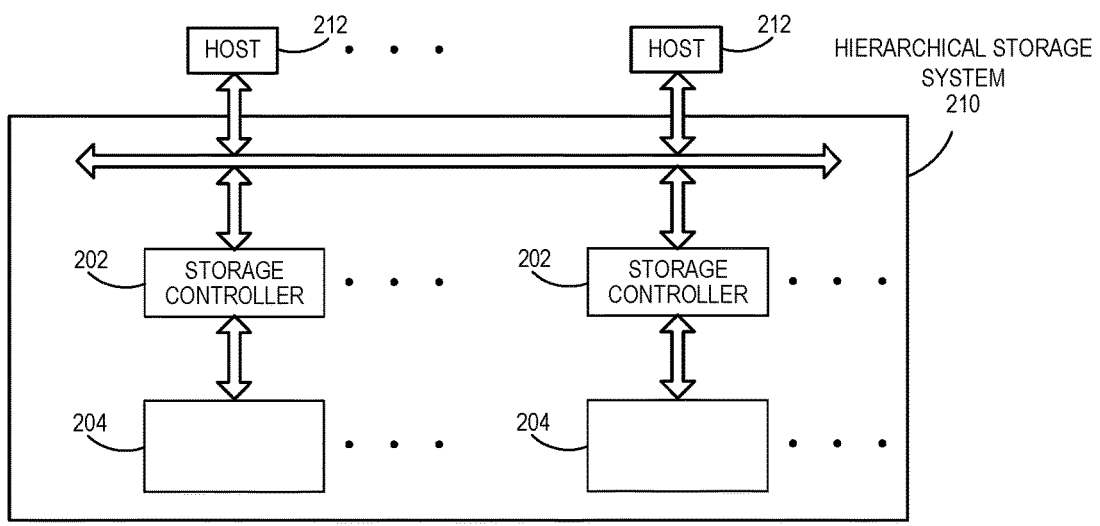
FIG. 1C is a block diagram of a hierarchical storage system.

FIG. 1C is a block diagram illustrating a hierarchical storage system 210. The hierarchical storage system 210 may include a plurality of storage controllers 202, each of which control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a SAS interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
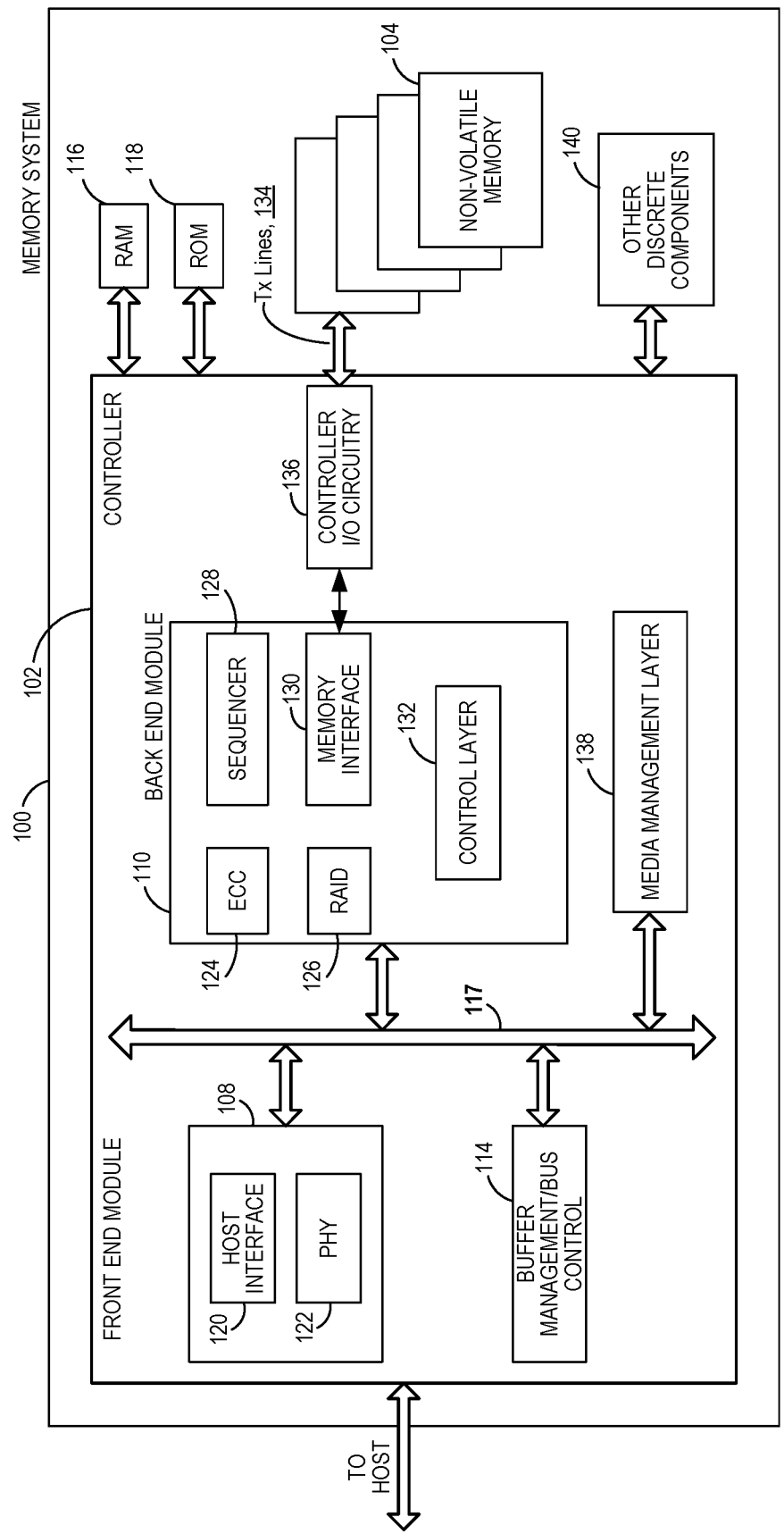
FIG. 2A is a block diagram of example components of a controller of the memory system of FIG. 1A.

FIG. 2A is a block diagram illustrating exemplary components of the controller die 102 in more detail. The controller die 102 may include a front end module 108 that interfaces with a host, a back end module 110 that interfaces with the memory dies 104, and various other modules that perform various functions of the memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller die 102 may include a buffer manager/bus controller module 114 that manages buffers in random access memory (RAM) 116 and controls the internal bus arbitration for communication on an internal communications bus 117 of the controller die 102. A read only memory (ROM) 118 may store and/or access system boot code. Although illustrated in FIG. 2A as located separately from the controller die 102, in other embodiments one or both of the RAM 116 and the ROM 118 may be located within the controller die 102. In yet other embodiments, portions of RAM 116 and ROM 118 may be located both within the controller die 102 and outside the controller die 102. Further, in some implementations, the controller die 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Examples types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction controller (ECC) engine 124 that encodes the data bytes received from the host, and decodes and error corrects the data bytes read from the memory dies 104. Additionally, the back end module 110 may include a RAID (Redundant Array of Independent Drives) module 128 that manages generation of RAID parity and recovery of failed data. The RAID parity may be used as an additional level of integrity protection for the data being written into the memory system 100. In some cases, the RAID module 128 may be a part of the ECC engine 124.

In addition, the back end module 110 may include a command sequencer 128 and a memory interface 130. The controller die 102 may include a control layer 132 (e.g., a flash controller layer) that controls the overall operation of the back end module 110.

The command sequencer 128 may be configured to generate command sequences, such as program, read, and erase command sequences, to be transmitted to the memory dies 104. The commands of the command sequences that the command sequencer 128 outputs may be referred to as context commands. For example, commands of command sequences for read operations may be referred to as read context commands, and commands of command sequences for write operations may be referred to as write context commands.

The memory interface 130 is configured to output the command sequences or context commands to the memory dies 104 and receives status information from the memory dies 104. Along with the command sequences and status information, the memory interface 130 may also be configured to send and receive data, such as in the form of data signals, to be programmed into and read from the memory dies 104. The memory interface 130 may also be configured to output clock signals or strobe signals to control the timing at which the memory dies 104 receive data signals carrying data to be programmed and/or at which the memory dies 104 output data signals carrying data the controller die 102 wants read from the memory dies 104.

As shown in FIG. 2A, the memory system 100 may include a plurality of transmission (Tx) lines (or channels) 134 connecting the controller die 102 and the plurality of memory dies 104. In general, a transmission line is any conductive structure or combination of conductive structures configured to conduct alternating current (AC) or radio frequency (RF) signals from a transmitter that is transmitting the signals to a receiver that is receiving the signals. For the example memory systems described herein, transmission lines are included to communicate signals between (including to and from) the controller die 102 and the memory dies 104. The controller die 102 and the memory dies 104 may be configured to communicate signals—including data signals, clock signals, and command signals—over the plurality of transmission (Tx) lines 134. A signal that is communicated between the controller die 102 and the memory dies 104 may be either transmitted from the controller die 102 over one of the transmission lines 134 to the memory dies 104, or transmitted from the memory dies 104 over one of the transmission lines 134 to the controller die 102. In this context, the controller die 102 and each of the memory dies 104 may be configured as transceiver circuits (or dies) in that they may each be configured to transmit and receive signals.

The controller 102 may be coupled to the transmission lines 134 via its memory interface 130. When the controller die 102 wants to send a signal to the memory dies 104, the controller die 102 may send the signal through its memory interface 130 onto one of the transmission lines 134. The memory dies 104 may each have their own respective memory interfaces to send and receive signals, as described in further detail below with respect to FIG. 3. When referring to the memory interfaces, the memory interface of the controller die 102 may be referred to as a controller-side memory interface 130, and the memory interfaces of the memory dies 104 may be referred to as memory-side memory interfaces.

Additionally, the memory interface 130 may include or be in communication with controller input/output (I/O) circuitry 136, which includes the circuitry that sends, receives, and generates the analog signals communicated on the transmission lines 134. The controller I/O circuitry 136 may include any of various configurations or circuitry topologies to send, receive, and generate signals. For example, to generate and output signals onto the transmission lines 134, the controller I/O circuitry 136 may include output driver circuits, such as in the form of push-pull circuits, that generate analog signals on the transmission lines 134 at certain predetermined high and low voltage levels. Also, to receive signals from the transmission lines 134, the controller I/O circuitry 136 may include input circuitry, such as in the form of input buffers, which, in some embodiments, may include comparators, such as Schmitt triggers or differential comparators, as non-limiting examples. In various embodiments, the I/O circuitry 136 may include other circuit components, such as pre-driver circuits, level shifter circuits, sampling circuits (e.g., latches or flip flops), and/or multiplexers, to transmit, receive, and generate the signals communicated on the transmission lines. Additionally, the controller I/O circuitry 136 may include conductive components, such as I/O contact pads disposed on the controller die 102 that connect to the transmission lines 134.

Additionally, the memory interface 130 and/or the controller I/O circuitry 136 may be configured to communicate with the memory dies 104 over the transmission lines 134 using any of various transmission modes, types, protocols, standards, or formats, non-limiting examples of which include double data rate (DDR), and/or a Toggle Mode (TM), such as TM 200, 400, or 800.

Additional modules of the non-volatile memory system 100 illustrated in FIG. 2A may include a media management layer 138, which may perform certain memory functions, such as address management (e.g., address translation) and wear leveling of memory cells of the memory dies 104. The memory system 100 may also include other discrete components 140, such as external electrical interfaces, external RAM, resistors, capacitors, or other components that may interface with the controller die 102. In alternative embodiments, one or more of the RAID module 128, media management layer 138 and buffer management/bus controller 114 are optional components that may not be necessary in the controller die 102.

Figure 2B:
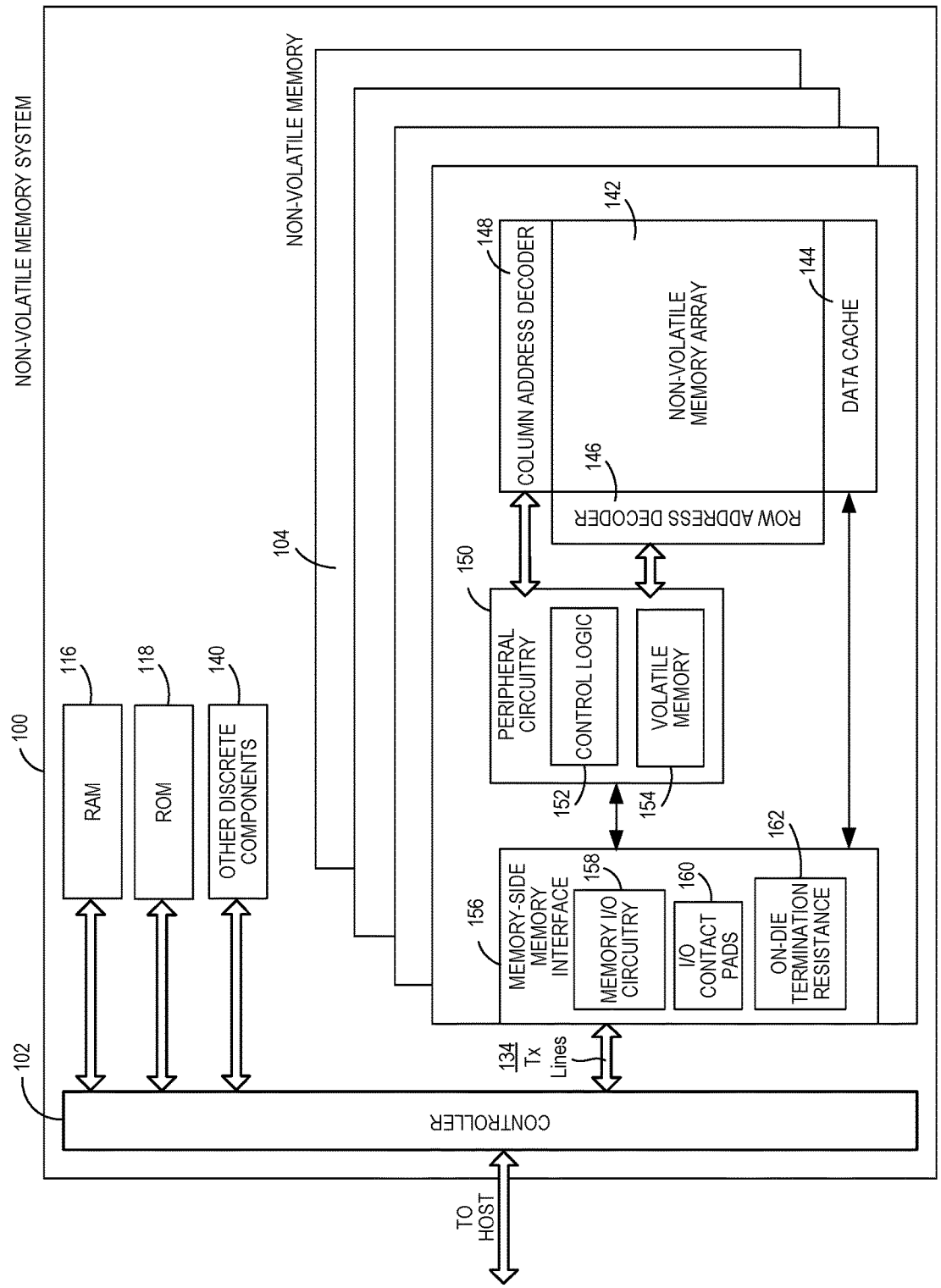
FIG. 2B is a block diagram of example components of a non-volatile memory die of the memory system of FIG. 1A.

FIG. 2B is a block diagram illustrating exemplary components of one of the memory dies 104 in more detail. The non-volatile memory die 104 may include a memory cell structure 142. In some example configurations, the memory cell structure 142 may be configured in the form of an array, such as two-dimensional or a three-dimensional array.

Any suitable type of memory can be used for the memory cells 142. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), phase-change memory ("PCM"), or other elements comprising semiconductor or other material capable of storing information. Each type of memory may have different configurations. For example, flash memory devices may be configured in a NAND or a NOR configuration.

The memory can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

Additional way of organizing the memory cells of the memory cell structure 142 may be possible. As a non-limiting example, the memory cells may be organized into blocks, and the blocks may be organized into planes. Additionally, the memory cells of the memory cell structure may be connected to biasing lines, including word lines and bit lines. Circuitry on the memory die may be configured to bias the word lines and bit lines with various voltages in order to perform memory operations associated with the memory cells, including read, program, and erase operations.

The memory die 104 may further include a page buffer or data cache 144 that caches data that is sensed from and/or that is to be programmed to the memory cell structure 142. The memory die 104 may also include a row address decoder 146 and a column address decoder 148. The row address decoder 146 may decode a row address and select a particular wordline in the memory array 142 when reading or writing data to/from the memory cells in the memory array 142. The column address decoder 148 may decode a column address to select a particular group of bitlines in the memory array 142 to be electrically coupled to the data cache 144.

In addition, the memory die 104 may include peripheral circuitry 150. The peripheral circuitry 150 may include control logic circuitry (otherwise referred to as an on-chip controller, memory die controller, or simply controller) 152, which may be implemented as a state machine, that provides on-chip control of memory operations as well as provide status information to the controller 102. The peripheral circuitry 150 may also include volatile memory 154. An example configuration of the volatile memory 154 may include latches, although other configurations are possible.

Also, the memory die 104 may include a memory-side memory interface (or just memory-side interface) 156 that is configured to interface and communicate with the controller-side memory interface 130 of the controller die 102. In particular, the memory-side interface 156 may be coupled with the transmission lines 134 of the memory system 100. When a given memory die 104 is to transmit a signal to the controller die 102, the given memory die 104 may transmit the signal via its memory-side interface 156 onto one of the transmission lines 134 to the controller die 102. Additionally, when a given memory die 104 is to receive a signal from the controller die 102, the given memory die 104 may receive the signal via its memory-side interface 156 from one of the transmission lines 134. As described in further detail below, components of the memory-side interface 156, along with die capacitance of the dies may form part of and/or determine characteristics impedances of the transmission lines 134.

The memory-side interface 156 may include memory input/output (I/O) circuitry 158 that is configured to send, receive, and generate signals, including data signals carrying data, command signals identifying commands, clock signals, or other types of signals carrying other information to be transmitted to and received from the controller die 102. For example, data sensed into the data cache 144 may be sent to the memory I/O circuitry 158 for transmission to the controller die 102. Similarly, data received from the controller die 102 may be received by the memory I/O circuitry 158, and the memory I/O circuitry 158 may communicate the data to the data cache 144. Additionally, commands to be communicated between the controller die 102 and the control logic 152 may be communicated via the memory I/O circuitry 158. The memory I/O circuitry 158 may be configured similar to and/or have similar or the same circuit topologies have any of various circuit or combinations of circuits, including output driver circuits, such as in the form of push-pull circuits, to generate and output signals onto the transmission lines 134, and input buffers, such as in the form of comparators and/or Schmitt trigger circuits to receive signals on the transmission lines 134. Any of various suitable circuit configurations to transmit, receive, and generate signals and connect to the transmission lines 134 to communicate the signals may be possible.

Additionally, the memory-side interface 156 may include input/output (I/O) contact pad portions 160 in communication with the memory I/O circuitry 158. For example, the signals that the memory I/O circuitry 158 generates for transmission to the controller die 102 may be communicated from the output driver circuits of the memory I/O circuitry 158 to the I/O contact pads 160. Similarly, the signals that the memory-side interface 156 receives from the controller die 102 may be sent from the I/O contact pads 160 to input circuits (e.g., input buffer circuits) of the memory I/O circuitry 158. In addition, as described in further detail below, the I/O contact pads 160, along with wire bond elements (WBE) (shown in FIG. 3) may form or be part of the transmission lines 134 over which the memory dies 104 and the controller die 102 communicate signals between each other.

Also, in at least some embodiments, as shown in FIG. 2B, the memory-side interface 156 may include on-die termination (ODT) resistance circuitry 162, which may include one or more resistors or other circuit components (active and/or passive) providing a resistance. The on-die termination resistance circuitry 162 may provide termination resistance or impedance for the transmission lines 134, and may be used for impedance matching between the memory dies 104 and the transmission lines 134. The on-die termination resistance circuitry 162 may be connected to the I/O contact pads 160. In addition, for at least some embodiments, the on-die termination resistance circuitry 162 may provide variable resistance levels or values, including one or more high levels and one or more low levels, as described in further detail below. The resistance levels or values that the on-die termination resistances provide may be controlled by the controller die 102, the on-die control logic 152, or a combination thereof.

Figure 3:
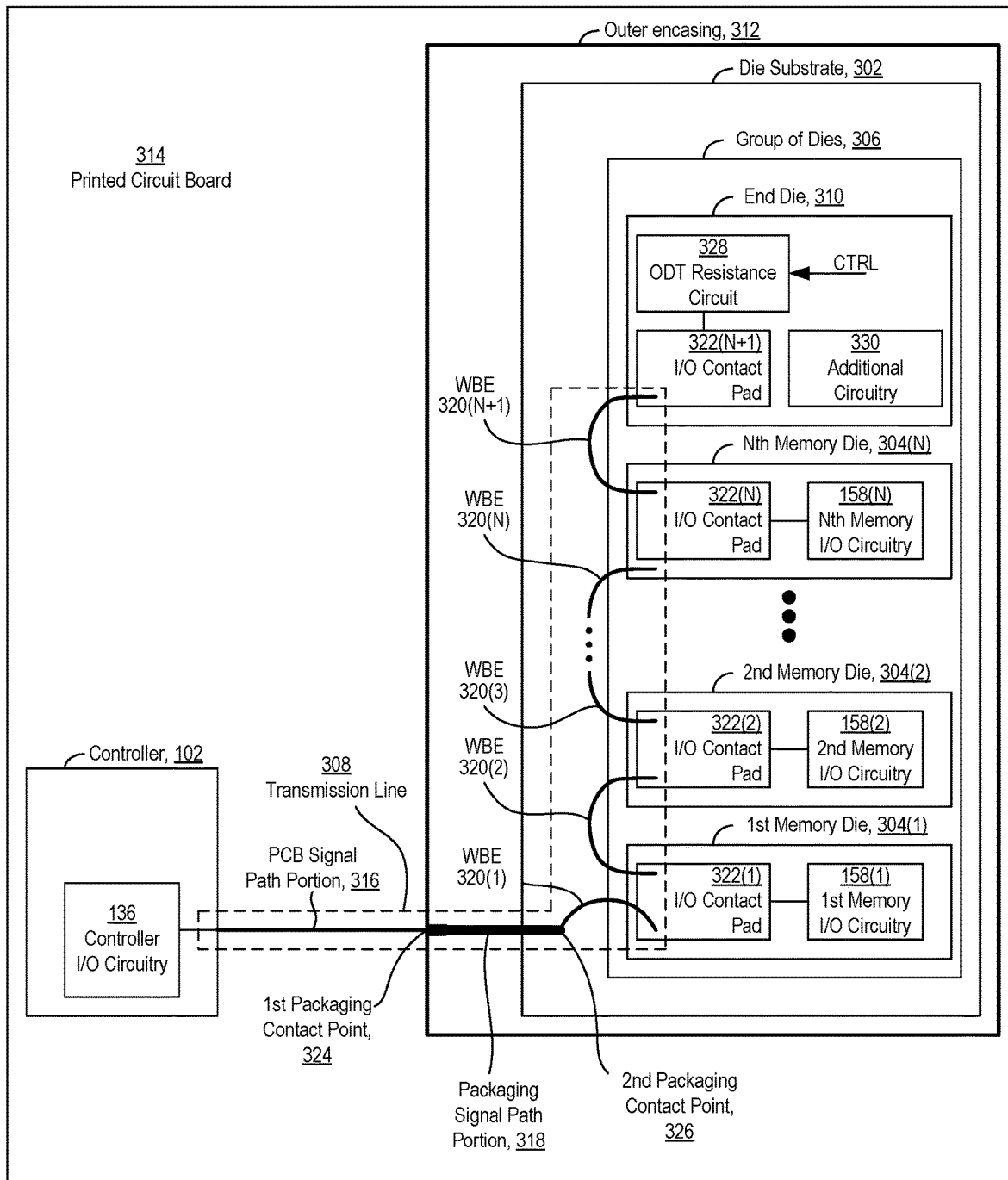
FIG. 3 is a physical layout of an example configuration of at least some of the components of the controller and a group of dies including an N-number of memory dies and an end die coupled to a transmission line.

FIG. 3 shows a physical layout of an example configuration of at least some of the components of the controller die 102 and the plurality of memory dies 104 shown in FIGS. 1A-2B. In FIG. 3, at least some of the memory dies 104 are represented by an N-number memory dies 304, including a first memory die 304(1), a second memory die 304(2), and an Nth memory die 304(N). In various embodiments, N may be any integer of two or more. The N-number of memory dies 304(1)-304(N) may be all of the memory dies 104 in the memory system 100, or may be less than all of the memory dies 104. For example, the N-number of memory dies 304(1)-304(N) may be located on the same chip and/or may be part of the same chip enable group. The memory system 100 may include a single chip or chip enable group in which the memory dies 104 are located. The N-number of memory dies 304 of FIG. 3 may be representative of that single chip or chip enable group of dies. Alternatively, the memory system 100 may include multiple chips or chip enable groups, and some of the memory dies 104 may be located on one chip or in one chip enable group, while other memory dies 104 may be located on one or more other chips or in one or more other chip enable groups. The N-number of memory dies 304 of FIG. 3 may be representative of one of the plurality of chips or chip enable groups. In addition or alternatively, the N-number of memory dies 304 may be configured as or part of the same die stack. Various configurations are possible. Further details of dies configured as a die stack are described in further detail below with reference to FIG. 4.

In addition, the memory dies 304 may be part of a group of dies (or die group) 306 that further includes an end (or termination) die 310. The end die 310 is described in further detail below.

In the example configuration shown in FIG. 3, the group of dies 306, including the memory dies 304 and the end die 310, may be configured in and/or integrated with a packaging that includes various packaging components, including a package or die substrate 302 on which the die group 306 is disposed or mounted, and an outer encasing or cover 312 that encases, covers, houses, and/or protects the dies of the die group 306. Other packaging components may be included, such as traces and vias integrated in the die substrate 302, solder balls, contact pads, and/or wire bonds, as non-limiting examples, at least some of which are described in further detail below. The controller die 102 may be configured and/or implemented as its own chip and/or integrated with its own packaging separate to that of the die group 306. (For simplicity, packaging components of the controller die 102 are not shown in FIG. 3). The controller die 102 and the die group 306 integrated with the packaging may be integrated, mounted, or disposed on a printed circuit board 314, as shown in FIG. 3.

The controller die 102 and the memory dies 304(1)-304(N) may communicate signals between each other on transmission lines (e.g., at least some of the transmission lines 134 of FIGS. 2A and 2B) connecting the controller die 102 and the memory dies 304(1)-304(N). For simplicity, the physical layout of FIG. 3 shows a single transmission line 308 connecting the controller die 102 and the memory dies 304. However, in actual implementation as described with reference to FIGS. 2A and 2B, there may be multiple transmission lines between the controller 102 and the memory dies 304(1)-304(N) configured to communicate data signals, clock signals, strobe signals, command signals, status signals, or any other type of signals between the controller die 102 and the memory dies 304. The multiple (at least two) transmission lines may be configured in parallel with each other such that two or more signals propagating on two or more parallel transmission lines may be communicated separately and/or simultaneously.

In addition, the transmission line 308 may be a unidirectional transmission line or a bidirectional transmission line. A unidirectional line is a transmission line that is configured to communicate signals one way or in one direction, either only from the controller die 102 to the memory dies 304, or only from the memory dies 304 to the controller die 102. In contrast, a bidirectional line is a transmission line that is configured to communicate signals both ways or in both directions, from the controller die 102 to the memory dies 304, and from the memory dies 304 to the controller die 102. For configurations that include multiple transmission lines, in various embodiments, all of the transmission lines may be unidirectional lines, all of the transmission lines may bidirectional lines, or the transmission lines may include a combination of at least one unidirectional line and at least one bidirectional line. Various configurations of unidirectional and/or bidirectional transmission lines may be possible.

Additionally, for some example configurations, the transmission line 308 may be configured as a single-ended transmission line or signal path configured to communicate a single-ended signal. For such configurations, the single-ended transmission line 308 may be electrically coupled to a ground reference or return path (not shown in FIG. 3). For other example configurations, the transmission line 308 may be one of the conductive paths of a differential transmission line or signal path configured to communicate a differential signal. As described in further detail below, the transmission line 308 may include any of various types of conductive elements, such as traces, vias, solder balls, contact pads, and wire bonds, as non-limiting examples, to communicate a signal between the controller 102 and the memory dies 304.

In addition, the transmission line 308, whether it be for a single-ended configuration or a differential configuration, may include a printed circuit board (PCB) portion 316, a packaging portion 318, a wire bond portion 320, and an input/output (I/O) contact pad portion 322.

The PCB portion 316 may be integrated with the printed circuit board 314 and extend between the controller die 102 and the memory die packaging. In addition, the PCB portion 316 may be implemented as a conductive trace (such as in the form of a microstrip or a stripline, for example), one or more vias, any other type of conductive element, or combinations thereof, configured to carry a signal over the printed circuit board 314 from the controller die 102 to the memory die packaging.

In addition, the packaging portion 318 of the transmission line 308 may be configured to communicate signals between the PCB signal portion 316 and the wire bond portion 320. The packaging portion 318 may include a first packaging contact point 324 that connects to the PCB portion 316 in order to communicate signals between the PCB portion 316 and the packaging portion 318, and a second packaging contact point 326 that connects to the wire bond portion 320 in order to communicate signals between the packaging portion 318 and the wire bond portion 320. The packaging portion 318, including the first and second contact points 324, 326, may include any of various conductive elements and/or combinations of conductive elements to communicate signals between the PCB portion 316 and the wire bond portion 320, examples of which include solder balls, such as those of a ball grid array structure, vias, and/or traces integrated in the die substrate 302, contact pads, and wire bonds. Various configurations of the packaging portion 318 for connecting the PCB portion 316 with the wire bond portion 320 are possible.

Additionally, the wire bond portion 320 may include an (N+1)-number of wire bond elements (WBE) (or just wire bonds) 320(1) to 320(N+1), and the I/O contact pad portion 322 may include an (N+1)-number of I/O contact pads 322(1) to 322(N+1). Each of the I/O contact pads 322 may be integrated with, such as by being disposed on, a respective one of the memory dies 304 or the end die 310 of the die group 306. For at least some example configurations, such as the one shown in FIG. 3, a first wire bond 320(1) includes a first end connected to the second packaging contact point 326 and a second end connected to the I/O contact pad 322(1) of the first memory die 304(1). The other wire bond elements of the wire bond portion 320 may have each of the ends connected to an I/O contact pad of two different dies of the die group 306. For example, as shown in FIG. 3, a second wire bond 320(2) has a first end connected to the I/O contact pad 322(1) of the first memory die 304(1) and a second end connected to the I/O contact pad 322(2) of the second memory die 304(2); a third wire bond 320(3) has a first end connected to the I/O contact pad 322(2) of the second memory die 304(2) and a second end connected to the I/O contact pad 322(3) of a third memory die 304(3) (not shown); an Nth wire bond 320(N) has a first end connected to an I/O contact pad 322(N−1) of an (N−1)th memory die 304(N−1) (not shown) and a second end connected to an I/O contact pad 322(N) of the Nth memory die 304(N); and an (N+1)th wire bond 320(N) has a first end connected to the I/O contact pad 322(N) of the Nth memory die 304(N) and a second end connected to the I/O contact pad 322(N+1) of the end die 310.

With respect to the packaging components and/or the transmission line 308, the die group 306 includes those dies that are mounted on the same die substrate 302, housed within the same outer encasing 312, and/or have I/O contact pads 322 coupled to wire bonds 320 that are connected in series from the packaging portion 318 to the (N+1)th I/O contact pad 316(N+1) of the end die 310.

The wire bonds 320 and the I/O contact pads 322, in combination, may form a part or a portion of the transmission line 308, with each wire bond 320 and each I/O contact pad 322 having positions relative to each other in the transmission line 308 that correspond to propagation delay or electrical distance from the packaging portion 318. A signal transmitted from the controller die 102 on the transmission line 308 may take a shorter amount of time to reach a given I/O contact pad 322 or a given wire bond element 320 that is positioned electrically closer to the packaging portion 318, compared to a given I/O contact pad or a given wire bond element positioned electrically farther from the packaging portion 318, along the transmission line 308.

The memory dies 304, the wire bond elements 320, and the I/O contact pad 322 are numbered in FIG. 3 to correspond to their respective positions in the transmission line 308. Given an index k, the higher the value of k, the further away a kth memory die 304(k), a kth wire bond element 314(k), and/or a kth I/O contact pad 316(k) are electrically along the transmission line 308 from the packaging portion 318, the PCB portion 316, and the controller die 102. In this context, the (N+1)th I/O contact pad 322(N+1) is the electrically furthest of the I/O contact pads 322 along the transmission line 308 from the packaging portion 318, the PCB portion 316, and/or the controller die 102, and, in turn, is or functions as a memory-side end or termination of the transmission line 308. In this context, the end die 310 is the die that is the furthest of the dies of the die group 306 from the packaging portion 318, the PCB portion 316, and/or the controller die 102 with reference to the transmission line 308. In addition or alternatively, the end die 310 is the die that includes the (N+1)th I/O contact pad 322(N+1) that functions as the memory-side end or termination of the transmission line 308.

The die group 306 may be configured in any of various ways within the memory system 100. In one example configuration, the die group 306 is configured as a die stack. In general, a given die may be a generally planar structure having two opposing planar surfaces, including a first planar surface and a second planar surface. In a die stack, the dies may be disposed on or "stacked" on top of one another, starting with a first or base die and extending in a direction perpendicular to planar surfaces of the dies. As a die stack, one planar surface of one die may face and/or contact a planar surface of a second die. Also, two dies are adjacent to each other where no other dies of the stack are disposed in between them. Also, in some example configurations, a first or base die may be disposed or mounted on a base substrate or a printed circuit board directly. A last die of the stack may be the die that is disposed furthest from the base substrate or printed circuit board on which the die stack is mounted.

One type of die stack is a staircase stack. In a staircase stack, the dies may be stacked on top of one another such that the dies do not completely cover each other. Instead, each die has an exposed portion where respective I/O contact pads may be disposed and connected with each other via wire bonds. By disposing the dies on top of one another to create exposed portions, the dies of the die stack, when viewed from the side, have a "staircase" shape, which each die being one of the "steps" of the staircase.

Figure 4:
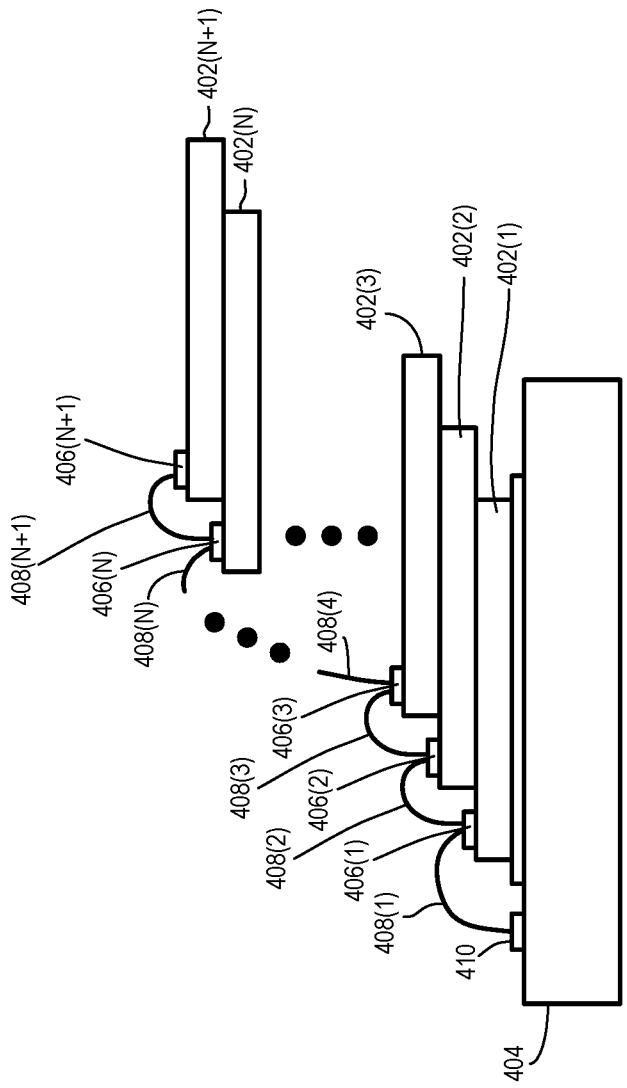
FIG. 4 is a side view of a plurality of dies integrated as a staircase stack.

FIG. 4 shows a side view of a plurality of dies 402 integrated or configured as a staircase stack. The plurality of dies 402 includes an N-number of memory dies 402(1) to 402(N) that are representative of the N-number memory dies 304(1)-304(N), and an (N+1)th die 402(N+1) that is representative of the end die 310 of the die group 306. The plurality of dies 402 illustrate an example configuration in which the die group 306 may be integrated with each other and the packaging.

In the example configuration shown in FIG. 4, the stack of dies 402 may be disposed on a die substrate 404. In particular, a first memory die 402(1) may be in contact with and/or be the closest of the memory dies 402 to the die substrate 404. The other memory dies 402(2)-402(N+1) are stacked on the first memory die 402(1) in a staircase configuration such that the second memory die 402(2) is disposed on the first memory die 402(1), the third memory die 402(3) is disposed on the second memory die 402(2), and the (N+1)th (or end) die 402(N+1) is disposed on an Nth memory die 402(N).

Also, each of the dies 402 may have respective I/O contact pads 406. The side view of FIG. 4 shows an I/O contact pad 406 on each of the dies 402, with the first memory die 402(1) including a first contact pad 406(1), the second memory die 402(2) including a second contact pad 406(2), the third memory die 402(3) including a third contact pad 406(3), the Nth memory die 402(N) including an Nth contact pad 406(N).

The staircase stack of dies 402 may also be configured with an N-number of wire bond elements 408. In particular, a first wire bond element 408(1) connects to the first I/O contact pad 406(1) of the first die 402(1) and to a contact pad 410 of the die substrate 404. In addition, the second through (N+1)th wire bonds 408(2) to 408(N+1) are each connected to two I/O contact pads 406 of two adjacent dies 402 in the staircase stack. For example, a second wire bond 408(2) is connected to the first I/O contact pad 406(1) on the first die 402(1) and the second I/O contact pad 406(2) of the second die 402(2); a third wire bond 408(3) connects to the second I/O contact pad 406(2) of the second die 402(2) and to the third I/O contact pad 406(3) of the third die 402(3); an Nth wire bond element 408(N) connects to an (N−1)th I/O contact pad 406(N−1) of an (N−1)th die 402(N−1) (not shown) and to the Nth I/O contact pad 406(N) of the Nth die 402(N); and (N+1)th wire bond element 408(N+1) connects to the Nth I/O contact pad 406(N) of an Nth die 402(N) and to the (N+1)th I/O contact pad 406(N+1) of the (N+1)th die 402(N+1).

Referring back to FIG. 3, the controller die 102 is shown as including the controller I/O circuitry 136, which is configured to send and receive signals communicated on the transmission lines 134, as previously described with respect to FIG. 2A. With respect to the configuration in FIG. 3, the controller I/O circuitry 136 is configured to send and receive signals communicated on the transmission line 308. For situations or embodiments where the controller 102 is to send a signal (e.g., a data signal, a clock signal, or a command signal) to the memory dies 304 via the transmission line 308, an output driver circuit of the controller I/O circuitry 136 generates and outputs the signal to the transmission line 308. In addition, for situations or embodiments where the controller 102 is to receive a signal from the memory dies 304 via the transmission line 308, an input circuit (e.g., an input buffer circuit) of the controller I/O circuitry 136 is configured to receive the signal from the transmission line 308.

Similarly, FIG. 3 shows each of the memory dies 304 as including respective memory I/O circuitry 158, as previously described with respect to FIG. 2B. For example, in FIG. 3, the first memory die 304(1) includes first memory I/O circuitry 158(1), the second memory die 304(2) includes second memory I/O circuitry 158(2), and the Nth memory die 304(N) includes Nth memory I/O circuitry 158(N). Each of the memory I/O circuitries 158 is configured to send and/or receive signals communicated on the transmission line 308. For situations or embodiments where a given kth memory die 304(k) is to send a signal (e.g., a data signal, a clock signal, or a command signal) to the controller die 102 via the transmission line 308, an output driver circuit of the kth memory I/O circuitry 158(k) generates and outputs the signal to the transmission line 308. In addition, for situations or embodiments where a given kth memory die 304(k) is to receive a signal from the controller die 102 via the transmission line 308, an input circuit (e.g., an input buffer circuit) of the kth memory I/O circuitry 158(k) is configured to receive the signal from the transmission line 308.

Figure 5:
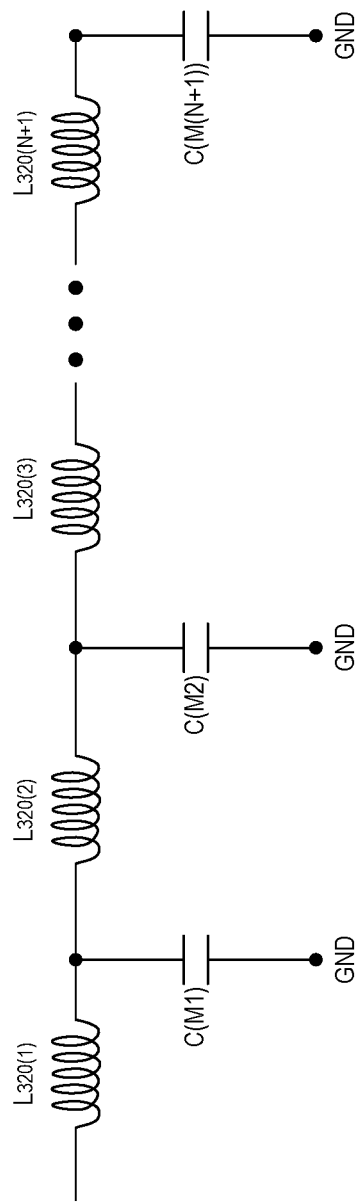
FIG. 5 is a circuit model of a wire bond portion of the transmission line of FIG. 3.

The portion of the transmission line 308 that extends over the wire bond portion 320 may have an associated characteristic impedance dependent on inductance values of the wire bonds 320 and the die capacitance of the dies 304, 310 of the die group 306. FIG. 5 shows a circuit schematic diagram of the inductance L provided by the wire bonds 320 and the die capacitance C(M) of the dies 304 corresponding to the configuration of FIG. 3. In particular, a first inductor $L_{320(1)}$ indicates the inductance of the first wire bond 320(1), a second inductance $L_{320(2)}$ indicates the inductance of the second wire bond 320(2), a third inductance $L_{320(3)}$ indicates the inductance of the third wire bond 320(3), and an (N+1)th inductance $L_{320(N+1)}$ indicates the inductance of the (N+1)th wire bond 320(N+1). Additionally, a first capacitor C(M1) represents a die capacitance of the first memory die 304(1), a second capacitor C(M2) represents a die capacitance of the second memory die 304(2), and an (N+1)th capacitor C(M(N+1)) represents a die capacitance of the end die 310. As shown in FIG. 5, the inductors $L_{320}$ are connected in series with each other, and the die capacitances C(M) are connected in shunt with respect to the inductors $L_{320}$ and with reference to ground (GND). The associated characteristic impedance of the wire bonds 320 is dependent on or determined by the square root of the inductance L divided by the capacitance C.

In order to optimize the quality of the transmission over the transmission line 308, the end die 310 includes an on-die termination (ODT) resistance circuit 328 connected to the associated I/O contact pad 322(N+1). The on-die termination resistance circuit 328 may have or provide an associated resistance. The resistance that the ODT resistance circuit 328 has or provides may be variable—i.e., it may be at one of a plurality of resistance levels or values.

The resistance levels that the ODT resistance circuit 328 may be set to may include at least two levels, including a high resistance level and a low resistance level. In addition, for at least some example configurations, the resistance levels may include a plurality of low levels, and/or a plurality of high levels. Accordingly, at a given moment in time, the ODT resistance circuit 328 may be configured to set its resistance to one of a plurality of high resistance levels and/or to set its resistance value to one of a plurality of low resistance levels.

Additionally, the ODT resistance circuit 328 may be configured to change or adjust its resistance from a first resistance level to a second resistance level. The first and second resistance levels may be any of various combinations of high and low resistance levels. That is, depending on the configuration, the ODT resistance circuit 328 may be configured to change its resistance from a high resistance level to a low resistance level, from a low resistance level to a high resistance level, from a first high resistance level of a plurality of high resistance levels to a second high resistance level of the plurality of high resistance levels (where the first high resistance level can be either higher or lower than the second high resistance level), or from a first low resistance level of a plurality of low resistance levels to a second low resistance level of the plurality of low resistance levels (where the first low resistance level can be either higher or lower than the second low resistance level).

In general, a high resistance level is higher than a low resistance level. In some example configurations, the high resistance level, is greater than or equal to 500 Ohms (Ω) and the low resistance level is lower than or equal to 100Ω. Example high resistance levels may be 500 Ohms, 1 kΩ, or 10 kΩ Example low resistance levels include 10 Ohms, 25 Ohms, 35 Ohms, 50 Ohms, 75 Ohms, and 100 Ohms. Other high and/or low resistance levels may be possible. In addition or alternatively, the high resistance level may be greater than or equal to ten times a characteristic impedance of the transmission line 308.

In addition, for some example configurations the high resistance level is a single or fixed value, and the low resistance level can be any one of a plurality of low resistance levels at any given moment in time. For such configurations, each of the low resistance levels is lower than the single high resistance level. For other example configurations, the low resistance level is a single or fixed value, and the high resistance level can be any one of a plurality of high resistance levels at any given moment in time. For such configurations, each of the high resistance levels is higher than the single low resistance levels. For still other example configurations, at any given moment in time, the high resistance level may be any one of a plurality of high resistance levels and the low resistance level may be any one of a plurality of low resistance levels. For such configurations, all of the high resistance levels are higher than all of the low resistance levels.

Also, in some example configurations, at a given point in time, the ODT resistance circuit 328 may set its resistance level to a high resistance level that is in a range of high resistance levels that includes an upper bound high resistance level and a lower bound high resistance level, and/or may set its resistance level to a low resistance level that is in a range of low resistance levels that includes an upper bound low resistance level and a lower bound low resistance level. At any given point in time, the ODT resistance circuit 328 may set its resistance to any one of a plurality of high resistance levels in the range of high resistance levels, and/or may set its resistance level to any one of a plurality of low resistance levels in the range of low resistance levels. In addition or alternatively, the resistance levels may be discrete values or levels, and the ODT resistance circuit 328 may set its resistance level to one of the discrete resistance levels. In particular example configurations, the discrete levels may form or determine a range of high resistance levels or a range of low resistance levels. To illustrate, suppose for example that at any given moment in time, the ODT resistance circuit 328 is configured to set its resistance to a high resistance level that may be any one of a plurality of predetermined or discrete high resistance levels, including 500 Ω, 1 kΩ, or 10 kΩ Accordingly, the resistance levels of 500 Ω, 1 kΩ, and 10 kΩ may determine a high resistance level range, where 10 kΩ is the upper bound of the range and 500Ω is the lower bound of the range. As another illustration, suppose for example that at any given moment in time, the ODT resistance circuit 328 is configured to set its resistance to a low resistance level that may be any one of a plurality of predetermined or discrete low resistance levels, including 10 Ω, 35Ω, and 50Ω. Accordingly, the resistance levels of 10 Ω, 35Ω, and 50Ω may determine a low resistance level range, where 50Ω is the upper bound of the range and 10Ω is the lower bound of the range.

For simplicity, as used hereafter and unless expressly specified otherwise, the ODT resistance circuit 328 being at, set to, and/or adjusted to a low level may mean that the ODT resistance circuit 328 is at, set to, and/or adjusted to a resistance level that is lower than the high resistance value or a lowest of a plurality of high resistance levels to which the ODT resistance circuit 328 may be set, which may not necessarily be an absolute low level. Similarly, the ODT resistance circuit 328 being at, set to, and/or adjusted to a high level may mean that the ODT resistance circuit 328 is at, set to, and/or adjusted to a resistance level that is higher than the low resistance value or a highest of a plurality of low resistance levels to which the ODT resistance circuit 328 may be set, which may not necessarily be an absolute high level.

The resistance level that the ODT resistance circuit 328 provides may be determined and/or controlled by the controller die 102, the end die 310 itself, such as by their on-die control circuits 152 (FIG. 2B), or a combination thereof. As shown in FIG. 3, the ODT resistance circuits 328 may be configured to receive a control signal CTRL that sets and/or adjusts the resistance level. For some example configurations, the controller die 102 may send a command signal to the plurality of memory dies 304 that indicates one or more resistance levels of the ODT resistance circuit 328. In response, the end die 310 may set the ODT resistance circuit 328 to the resistance level indicated by the command signal. For example, the on-die control circuit 152 of the end die 310 may output the control signal CTRL to the ODT resistance circuit 328.

In addition, the ODT resistance circuit 328 may be part of or coupled to the transmission line 308. In particular, the ODT resistance circuit 328 may be and/or referred to as a dedicated end-die termination resistance circuit 328 that provides an end or termination resistance of the transmission line 328. The end or termination resistance provided by the dedicated end-die termination resistance circuit 328 may be also be referred to as a memory-side end or termination resistance, as opposed to a controller-side end or termination resistance that the controller die 102 provides.

Figure 6:
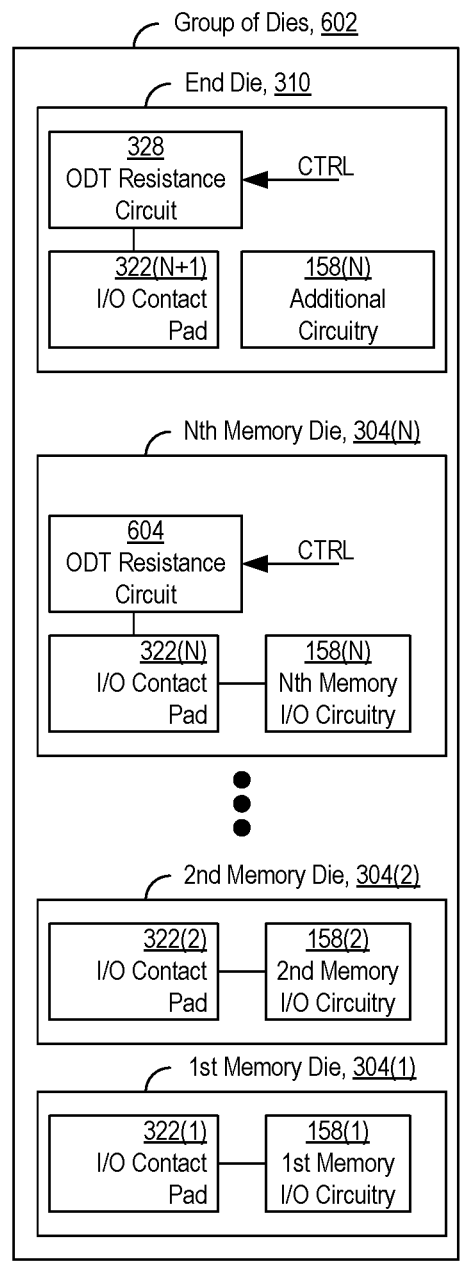
FIG. 6 is an alternative configuration for the group of dies of FIG. 3, where at least one of the N-number of memory dies also include an on-die termination resistance circuit.

In various embodiments, none, or at least one, of the memory dies 304 similarly includes an ODT resistance circuit, like the ODT resistance circuit 328 of the end die 310, such that an M-number of dies of the die group 306 that includes an ODT resistance circuit coupled to the transmission line 308 is less than the total N+1 number of dies of the die group 306. Accordingly, at least one of the dies of the group 306 does not include an ODT resistance circuit connected to its I/O contact pad forming part of the transmission line 308. In particular example embodiments, such as the one shown in FIG. 3, only the end die 310 has its ODT resistance circuit 328, and the other dies of the die group— i.e., all of the N-number of memory dies 304(1) to 304(N)— are configured without ODT resistance circuits coupled to the transmission line 308. In other example embodiments, in addition to the end die 310, at least one but less than all of the memory dies 304 includes an ODT resistance circuit coupled to the transmission line 308. For example, FIG. 6 shows an alternative die group 602, where the Nth memory die 304(N) includes an ODT resistance circuit 604 coupled to its I/O contact pad 322(N), like the end die 310.

In general, an ODT resistance circuit may include one or more resistors in combination with one or more transistors (switches) to provide a variable resistance, such as at one or more high resistance levels and/or one or more low resistance levels, as previously described. Such circuit components cause the ODT resistance circuit to have an associated capacitance, which adds to the die capacitance of the die in which the ODT resistance circuit is configured, increasing an effective die (or parasitic) capacitance that contributes to the characteristic impedance of the transmission line 308 over the wire bond portion 320. The higher the effective die capacitance, the more limited the frequency, bandwidth, or data rate at which signals can be transmitted over the transmission line 308 with sufficient quality.

In other example embodiments, all of the dies of the die group 306—i.e., all of the memory dies 304 and the end die 310—are configured with an ODT resistance circuit. While these embodiments may be optimal from a manufacturing perspective since all of the dies have the same ODT configuration, such embodiments provide a less than optimal effective die capacitance for the transmission line 308. In contrast, reducing the number of dies of the die group 306 that has an ODT resistance circuit coupled to the transmission line 308 reduces the effective die capacitance. To illustrate, for a die group that includes 16 dies, configuring only the end die with a termination resistance circuit may reduce the effective die (or parasitic) capacitance by over 30% (e.g., from 2.4 picoFarads (pF) to 1.8 pF, in some embodiments). The reduction in capacitance, in turn, allows for increased frequency, bandwidth, and/or data rate at which signals can be transmitted over the transmission line 308 without degrading the quality of the transmissions below acceptable levels.

Additionally, die group configurations where none of the dies include an ODT resistance circuit may be less than optimal since none of the dies of the die group can terminate the transmission line with a termination resistance at a low level. In turn, the transmission line 308 is limited in terms of the frequency, bandwidth, and/or data rate of the signals that it can transmit with sufficient quality. Accordingly, configuring at least one of the dies of the die group 306, such as the end die 310, with an ODT resistance circuit, while configuring at least one of the other dies without an ODT resistance circuit, may provide an optimal combination of dies with and without ODT resistance circuits that desirably terminates the transmission line 308 with a low resistance level at the memory side while reducing the effective die capacitance, which in turn allows for signals to be communicated over the transmission line 308 between the controller die 102 and the die group 306 at higher frequencies, bandwidth, and/or data rates.

Also, by reducing the number of dies of the die group 306 that includes an ODT resistance circuit, power consumption may be reduced. The number of commands communicated over the transmission lines 134 to set the ODT resistances to the die group 306 may also be reduced, simplifying the overall process to set ODT resistance for communication between the controller die 102 and the die group 306.

In various example methods of operation, when the controller die 102 and the memory dies 304 communicate with each other over the transmission line 308—either by the controller die 102 transmitting a signal over the transmission line 308 to the memory dies 304, or one of the memory dies 304 transmitting a signal over the transmission line 308 to the controller die 102—the ODT resistance circuit 328 is set to the low resistance level. In some embodiments, the controller die 102 and the memory die 304 may be configured to communicate with each other over the transmission line 308 at different frequencies, including a high frequency and a low frequency. The high frequency and the low frequency may be predetermined values, where, in general, the high frequency is a higher value than the low frequency. During communication over the transmission line 308, whether the ODT resistance circuit 328 is set to the high level or the low level may depend on whether signal communicated over the transmission line is communicated at the high frequency or the low frequency. For such embodiments, when the controller die 102 and the memory dies 304 communicate at the high frequency, the end die 310 has the ODT resistance circuit 328 set to the low resistance level. Alternatively, when the controller die 102 and the memory dies 304 communicate at the low frequency, the end die 310 has the ODT resistance circuit 328 set to the high resistance level.

In some example embodiments, the end die 310 is a "dummy" die for the die group 306, in that it only has I/O contact pads and ODT resistance circuits coupled to the transmission lines 134, and/or its sole function is to provide memory-side termination resistances for the transmission lines 134. For other example embodiments, such as the one shown in FIG. 3, the end die 310 includes additional circuitry 330—i.e., in addition to I/O contact pads and ODT resistance circuits. The additional circuitry 330 may be configured to perform one or more functions for the memory system 100 other than provide a memory-side termination resistance for the transmission lines 134. For example, in some example embodiments, the end die 310 is another one of the memory dies 104, configured to store data, like the memory dies 304. Accordingly, the additional circuitry 330 includes at least some of the components of the memory die 104 shown in FIG. 2B. In other example embodiments, the additional circuitry 330 includes error correction circuitry that is configured to detect and/or correct for errors in signals communicated over the transmission lines 134, and/or perform diagnostics such as parity checks or bit error rate estimation. Other types of additional circuitry 330, and/or functions other than those for storing data, performing error correction or detection, or other diagnostics, may be possible.

In addition, in various example embodiments, the end die 310 may be the same size as the memory dies 304, or may have a smaller size than the memory dies 304. In particular embodiments, the end die 310 may be a smaller die where the end die is not also a memory die, and in turn does not require as large of a size as the memory dies 304. A smaller die may desirably reduce the size and/or cost associated with the die group 306.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. An apparatus comprising:
a transmission line; and
a group of dies coupled to the transmission line, wherein the group of dies comprises:
a first die configured with an on-die termination resistance circuit coupled to the transmission line, wherein the first die is not configured to store data; and
a second die configured without any on-die termination resistance circuits coupled to the transmission line.

2. The apparatus of claim 1, wherein none of the other dies of the group, except the first die, comprises a respective on-die termination resistance circuit coupled to the transmission line.

3. The apparatus of claim 1, wherein the first die comprises an end die of the group.

4. The apparatus of claim 1, wherein the group of dies is coupled to the transmission line via a wire bond portion of the transmission line.

5. The apparatus of claim 1, wherein the group of dies is configured as a die stack.

6. The apparatus of claim 5, wherein the die stack comprises a staircase stack.

7. The apparatus of claim 1, wherein the group of dies is configured to communicate over the transmission line at a predetermined high frequency and at a predetermined low frequency, and wherein the on-die termination resistance circuit is configured to:
set an associated resistance at a low level when the group of dies communicates over the transmission line at the predetermined high frequency; and
set the associated resistance at a high level when the group of dies communicates over the transmission line at the predetermined low frequency.

8. An apparatus comprising:
a controller die;
a group of dies configured to communicate with the controller die via a transmission line, wherein the group of dies comprises a plurality of memory dies and an end die that is not configured to store data,
wherein the end die comprises at least one on-die termination circuit coupled to the transmission line, and
wherein less than all of the group of dies comprises a respective one of the at least one on-die termination circuit.

9. The apparatus of claim 8, wherein only one of the dies of the group comprises the at least one on-die termination circuit coupled to the transmission line.

10. The apparatus of claim 9, wherein the only one of the dies comprises the end die.

11. The apparatus of claim 8, wherein the end die is configured to perform error correction.

12. The apparatus of claim 8, wherein the end die does not include additional circuitry other than input/output contact pads and on-die resistance circuits.

13. The apparatus of claim 8, wherein the group of dies is coupled to the transmission line via a wire bond portion of the transmission line.

14. The apparatus of claim 8, wherein the group of dies is configured as a die stack.

15. The apparatus of claim 14, wherein the die stack comprises a staircase stack.

16. The apparatus of claim 8, wherein the controller die and the group of dies are configured to communicate over the transmission line at a predetermined high frequency and at a predetermined low frequency, and wherein the at least one on-die termination resistance circuit is configured to:

set an associated resistance at a low level for communication over the transmission line at the predetermined high frequency; and set the associated resistance at a high level for communication over the transmission line at the predetermined low frequency.

17. A method comprising:

setting an on-die termination resistance circuit of an end die of a group of dies to a low level, the on-die termination resistance circuit coupled to a transmission line, wherein no other dies of the group of dies comprises a respective on-die termination resistance circuit, and wherein the end die does not contain memory; and communicating a signal over the transmission line between the group of dies and a controller die with the on-die termination resistance circuit set to the low level.

18. The method of claim 17, wherein communicating the signal comprises communicating the signal at a predetermined high frequency, and wherein setting the on-die termination resistance circuit to the low level is dependent on communicating the signal at the predetermined high frequency.

19. The method of claim 17, wherein the signal comprises a first signal, the method further comprises:

setting the on-die termination resistance circuit of the end die to a high level dependent on communicating a second signal over the transmission line at a predetermined low frequency; and communicating the second signal over the transmission line between the group of dies and the controller die with the on-die termination resistance circuit set to the high level.

* * * * *